US009462736B2

(12) United States Patent
Eom et al.

(10) Patent No.: US 9,462,736 B2
(45) Date of Patent: Oct. 4, 2016

(54) COMPOSITION AND METHODS OF FORMING SOLDER BUMP AND FLIP CHIP USING THE SAME

(71) Applicant: Electronics and Telecommunications Research Institute, Daejeon (KR)

(72) Inventors: Yong Sung Eom, Daejeon (KR); Jong Tae Moon, Gyeryong-si (KR); Sangwon Oh, Daejeon (KR); Keonsoo Jang, Suwon-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/325,482

(22) Filed: Jul. 8, 2014

(65) Prior Publication Data

US 2014/0317915 A1  Oct. 30, 2014

Related U.S. Application Data

(62) Division of application No. 13/835,791, filed on Mar. 15, 2013, now Pat. No. 8,802,760, which is a division of application No. 12/476,925, filed on Jun. 2, 2009, now Pat. No. 8,420,722.

(30) Foreign Application Priority Data

Jul. 10, 2008  (KR) ................. 10-2008-0067117
Feb. 11, 2009  (KR) ................. 10-2009-0011106

(51) Int. Cl.
| H05K 13/04 | (2006.01) |
| B23K 3/06 | (2006.01) |
| B23K 35/34 | (2006.01) |
| B23K 35/36 | (2006.01) |
| B82Y 10/00 | (2011.01) |
| B23K 35/24 | (2006.01) |
| H05K 3/46 | (2006.01) |
| H01L 23/00 | (2006.01) |
| H05K 3/32 | (2006.01) |
| H05K 3/34 | (2006.01) |

(52) U.S. Cl.
CPC ......... *H05K 13/0465* (2013.01); *B23K 3/0623* (2013.01); *B23K 35/24* (2013.01); *B23K 35/34* (2013.01); *B23K 35/3601* (2013.01); *B23K 35/3613* (2013.01); *B82Y 10/00* (2013.01); *H01L 24/29* (2013.01); *H01L 24/30* (2013.01); *H01L 24/83* (2013.01); *H05K 3/3484* (2013.01); *H05K 3/46* (2013.01); *B23K 2201/36* (2013.01); *H01L 2224/1141* (2013.01); *H01L 2224/1152* (2013.01); *H01L 2224/1184* (2013.01); *H01L 2224/16238* (2013.01); *H01L 2224/2784* (2013.01); *H01L 2224/27416* (2013.01); *H01L 2224/3003* (2013.01); *H01L 2224/73104* (2013.01); *H01L 2224/73204* (2013.01); *H01L 2224/81355* (2013.01); *H01L 2224/83886* (2013.01); *H05K 3/323* (2013.01); *H05K 3/3436* (2013.01); *H05K 2201/026* (2013.01); *H05K 2201/10977* (2013.01); *Y10T 29/49117* (2015.01); *Y10T 29/49126* (2015.01)

(58) Field of Classification Search
CPC .................................................. H05K 13/04
USPC .......................................................... 524/261
See application file for complete search history.

(56) References Cited

U.S. PATENT DOCUMENTS

| 5,136,365 A | 8/1992 | Pennisi et al. |
| 5,840,215 A | 11/1998 | Iyer et al. |
| 5,989,362 A | 11/1999 | Diamant et al. |
| 6,148,512 A * | 11/2000 | Brown .......................... 29/837 |
| 6,525,413 B1 * | 2/2003 | Cloud ................. H01L 25/0652 257/686 |
| 6,548,175 B2 | 4/2003 | Sachdev et al. |
| 6,656,291 B1 | 12/2003 | Ueda |
| 2005/0230667 A1 | 10/2005 | Komagata et al. |
| 2006/0060987 A1* | 3/2006 | Chen et al. .................. 257/787 |
| 2007/0145097 A1 | 6/2007 | Suh |
| 2009/0057378 A1 | 3/2009 | Hwang et al. |

FOREIGN PATENT DOCUMENTS

| KR | 10-0475324 B1 | 2/2005 |
| KR | 2005-0094478 | 9/2005 |
| KR | 2006-0007011 | 1/2006 |
| KR | 10-0606179 A | 7/2006 |

OTHER PUBLICATIONS

Kim J-M et al., "New Electrically Conductive Adhesives Filled with Low-Melting-Point Alloy Fillers", Materials Transactions, vol. 45, No. 1 (2004), pp. 157-160.
K. Gilleo, Assembly with Conductive Adhesives, Surface Mount International Conferene, San Jose CA, Aug./Sep. 1994.

* cited by examiner

*Primary Examiner* — Doris Lee
(74) *Attorney, Agent, or Firm* — Rabin & Berdo, P.C.

(57) ABSTRACT

Provided are a composition for an anisotropic conductive adhesive, a method of forming a solder bump and a method of forming a flip chip using the same. The composition for an anisotropic conductive adhesive includes a low melting point solder particle and a thermo-curable polymer resin. The anisotropic conductive adhesive includes forming a mixture by mixing a polymer resin and a curing agent, and mixing a deforming agent, a catalyst or a reductant with the mixture.

8 Claims, 13 Drawing Sheets

COMPOSITION AND METHODS OF FORMING SOLDER BUMP AND FLIP CHIP USING THE SAME

CROSS-REFERENCE TO RELATED APPLICATIONS

This is a divisional of co-pending U.S. application Ser. No. 13/835,791 filed on Mar. 15, 2013, which was in turn a divisional of application Ser. No. 12/476,925, filed Jun. 2, 2009. This U.S. non-provisional patent application also claims priority under 35 U.S.C. §119 of Korean Patent Application Nos. 10-2008-0067117, filed on Jul. 10, 2008, and 10-2009-011106, filed on Feb. 11, 2009, the entire contents of which are hereby incorporated by reference.

FIELD OF THE INVENTION

The present invention disclosed herein relates to a composition for an anisotropic conductive adhesive including a low melting point solder, a method of forming a solder bump, and a method for forming a flip chip, using the same.

RELATED ART

Various processes are performed to manufacture electronic devices. For example, packaging process may be performed to electrically connect semiconductor devices to an electronic printed circuit board such as a printed circuit board (PCB). In line with the development of electronic industries, flip chip technology of mounting ultra small-sized packages on a PCB has been proposed to manufacture high-capacity and high-speed electronic devices.

As one of flip chip packaging technologies, a packaging method of using an anisotropic conductive film manufactured by dispersing conductive particles into an insulating adhesive has been proposed. This packaging method includes inserting an anisotropic conductive film between objects to be bonded, and then heating and pressurizing them. However, as the conductive patterns become fine, this packaging method may cause conductive patterns to be electrically shorted. Moreover, high pressure is applied during the pressurizing process, which may lead the package to be damaged. In particular, if a substrate is made of glass, the glass may be broken due to high pressure.

SUMMARY OF THE INVENTION

The present invention provides a composition for an anisotropic conductive adhesive with excellent electrical properties.

The present invention also provides a method of forming a solder bump using the composition.

The present invention also provides a method of forming a flip chip using the composition.

Embodiments of the present invention provide compositions, including: a low melting point solder; a thermal-curable polymer resin; and a curing agent of an anhydride family material.

In some embodiments, the thermal-curable polymer resin may include a hydroxyl group, and the low melting point solder may serve as a catalyst.

In other embodiments, the composition may include a deforming agent which reduces a surface tension of the thermal-curable resin, and the deforming agent may include acrylate oligomer, polyglycols, glycerides, polyprophylene glycol, dimethylsilicone, simethicone, tributhyl phosphate, or polydimethylsiloxane.

In still other embodiments, the composition may further include a CNT-Cu (Carbon Nano Tube-Copper).

In other embodiments of the present invention, compositions include: a low melting point solder; a thermal-curable polymer resin; a curing agent of an amine family material; and a deforming agent which reduces a surface tension of the thermal-curable polymer resin.

In still other embodiments of the present invention, methods of forming a solder bump include: providing a first composition on a substrate having a conductive pattern, the first composition including a low melting point solder, a thermal-curable polymer resin, and a curing agent of an anhydride family material; and forming a solder pattern on the conductive pattern by agglomerating the low melting point solder.

In some embodiments, the forming of the solder pattern may include providing a thermal energy having a temperature higher than the melting point of the low melting point solder and lower than the curing temperature of the thermal-curable polymer resin, to the first composition.

In other embodiments, the method may further include removing the first composition including the low melting point solder not agglomerated on the conductive pattern.

In still other embodiments, the method may include providing a second composition on the substrate, the second composition including a thermal-curable polymer resin, forming a film by curing the second composition, and planarizing the film to expose the solder pattern.

In even other embodiments, the method may include providing a second composition on the substrate, the second composition including a photo-curable material, forming a film by curing the second composition, and planarizing the film to expose the solder pattern.

In yet other embodiments, the first composition may further include a photo-curable material, and the method may include performing an exposure process to define a region to be removed and a remaining region on a film formed of the first composition, and removing the region to be removed.

In even other embodiments of the present invention, methods of forming a flip chip include providing a first composition between a first substrate having first conductive patterns and a second substrate having second conductive patterns, the first composition including a low melting point solder, a thermal-curable polymer resin, and a curing agent of an anhydride family material, and forming a contact portion connecting the first conductive patterns and the second conductive patterns, the contact portion being made of the low melting point solder.

In some embodiments, the thermal-curable resin may include a hydroxyl group. Herein, a material having a carboxyl group may be generated through a reaction between the thermal-curable polymer resin having the hydroxyl group and the curing agent of the anhydride family material, and the material may be used as a reductant removing an oxide on the low melting point solder or on the first and second conductive patterns.

In other embodiments, the low melting point solder may be used as a curing catalyst.

In still other embodiments, the forming of the contact portion may include melting the low melting point solder and curing the thermal-curable polymer resin.

In even other embodiments, the process may further include providing a carbon nano tube-copper (CNT-Cu).

In yet other embodiments of the present invention, methods of forming a flip chip include preparing a first substrate on which first conductive patterns are formed and a second substrate on which second conductive patterns are formed, providing a first composition on the first substrate to cover the first conductive patterns, the first composition including a low melting point solder, a thermal-curable polymer resin, and a curing agent of an anhydride family material, forming first solder patterns on the first conductive patterns by agglomerating the low melting point solder, and assembling the first substrate and the second substrate for the first conductive patterns and the second conductive patterns to be electrically connected to each other through the first solder patterns.

In some embodiments, the forming of the first solder patterns may further include removing the first composition including the low melting point solder not agglomerated on the first conductive patterns and providing a second composition on the first substrate, the second composition including a thermal-curable polymer resin.

In other embodiments, the assembling of the first and second substrates may include aligning the first conductive patterns and the second conductive patterns, and reflowing the second composition.

In still other embodiments, the process may further include forming a first film on the first substrate by curing the second composition, planarizing the first film to expose the first solder patterns, and forming a second film on the second conductive patterns, the second film exposing the second solder patterns.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
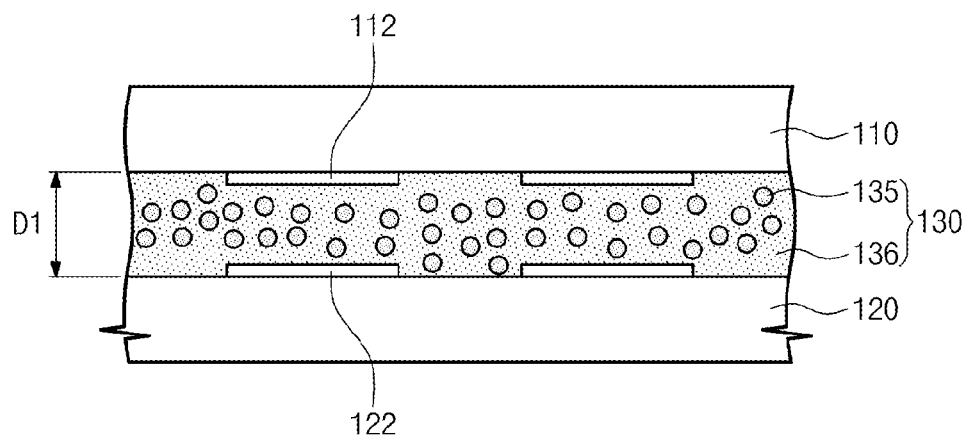
FIGS. 1 through 3 are cross-sectional views illustrating bonding process using an anisotropic conductive adhesive according to an embodiment of the present invention.

Embodiments of the present invention will be described below with reference to the accompanying drawings. Object(s), characteristic(s), and advantage(s) of the present invention will be easily understood through following embodiments associated with the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, like reference numerals refer to like elements throughout.

In the specification, it will be understood that when a material layer, e.g., a conductive layer, a semiconductor layer or an insulation layer, is referred to as being 'on' another material layer or substrate, it can be directly on the other material layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout. Also, though terms like a first, a second, and a third are used to describe various regions and materials in various embodiments of the present invention, the regions and the materials are not limited to these terms. These terms are used only to discriminate one region or layer from another region or layer. Therefore, a region referred to as a first region in one embodiment can be referred to as a second region in another embodiment.

Furthermore, in the specification, it should be appreciated that the term 'and/or' is used to indicate one of elements or all the elements specified before and after the term 'and/or'.

A composition for an anisotropic conductive adhesive will be set forth according to an embodiment of the present invention. The composition may include a thermo-curable mixture and a low melting point solder. The thermo-curable mixture may be cured at a temperature higher than the melting point of the low melting point solder.

The thermo-curable mixture may include a thermal-curable polymer resin (hereinafter, referred to as a polymer resin), and a curing agent. Additionally, the thermo-curable mixture may include a deforming agent, a catalyst and/or a reductant.

The polymer resin may include, for example, DiGlycidyl Ether of Bisphenol of A (DGEBA), TetraGlycidyl Diamine Diphenyl Methane (TGDDM), Tri-Glycidyl p-Aminophenol, isocyannate, and/or bismaleimide.

The deforming agent may include acrylate oligomer, polyglycols, glycerides, polyprophylene glycol, dimethylsilicone, simethicone, tributhyl phosphate, and/or polydimethylsiloxane. The deforming agent may reduce the surface tension of the thermo-curable mixture, thereby improving fusion and wetting properties between particles of the low melting point solder. The content of the deforming agent may be about 50% by weight based on the polymer resin. If the content of the deforming agent exceeds about 50% by weight, the deforming agent may not have an effect on the fusion and wetting properties of particles of the low melting point solder any longer.

The curing agent may include an amine family material or an anhydride family material. The amine family material may include meta-phenyleneDiAmine (MPDA), Diamino Diphenyl Metahne (DDM), and/or DiaminoDiphenyl Sulfone (DDS). The anhydride family material may include 2-Methyl-4-NitroAniline, (MNA), DoDecenly Succinic Anhydride (DDSA), Maleic Anhydride (MA), Succinic Anhydride (SA), MethylTetraHydroPhthalic Anhydride (MTHPA), HexaHydro Phtahlic Anhydride (HHPA), Tetrahydrophthalic Anhydride (THPA), and/or PyroMellitic DiAnhydride (PMDA). The equivalence ratio of the curing agent to the polymer resin may be in the range of about 0.1 to about 1.5. When the equivalence ratio is less than about 0.1, the polymer resin may not be cured well. When the equivalence ratio is more than about 1.5, the durability against high temperature and humidity of the cured polymer resin may be deteriorated.

The catalyst may include Benzyl DiMethyl Amine (BDMA), $BF_3$-Mono Ethyl Amine ($BF_3$-MEA), tris(dimethylaminomethyl)phenol (DMP-30), DiMethylBenzAnthracene (DMBA), and/or Methyl Imidazole (MI). The content of the catalyst may be about 10 weight % or less based on the polymer resin in consideration of a curing time of the polymer resin. According to an embodiment, when the curing agent is an anhydride family material, the low melting point solder may serve as a curing catalyst and therefore the thermo-curable mixture may not include an additional catalyst.

The reductant may include a material having a carboxyl group (COOH—). For example, the reductant may include glutaric acid, maleic acid, azelaic acid, abietic acid, adipic acid, ascorbic acid, acrylic acid, and/or citric acid. Considering the reduction properties of the low melting point solder and the reactivity with the polymer resin, the content of the reductant may be about 50 weight % or less based on the polymer resin. According to an embodiment, when the curing agent may be an anhydride family material and the polymer resin contains a hydroxyl group (OH—), the curing agent and the polymer resin react with each other to produce a material having a carboxyl group (COOH—). The material having the carboxyl group act as a reductant, and thus the thermo-curable mixture may not include a reductant additionally, or may include a slight amount of the reductant. For example, the content of the reductant may be about 20 weight % or less based on the polymer resin.

The low melting point solder may include tin (Sn), bismuth (Bi), indium (In), silver (Ag), lead (Pb) and/or copper (Cu). For example, the low melting point solder may have a composition of 60Sn/40Bi, 52In/48Sn, 97In/3Ag, 57Bi/42Sn/1Ag, 58Bi/42Sn, 52Bi/32Pb/16Sn, 96.5Sn/3Ag/0.5Cu, 96.5Sn/3.5Ag, and/or Sn. A particle size of the low melting point solder may be selected according to a size, e.g., pitch, of a conductive pattern. As the size of the conductive pattern increases, the low melting point solder with large sized particles may be used. For example, the particle size of the low melting point solder may be selected from the range of about 5 nm to about 100 μm. The volume percent of the low melting point solder may be in the range of about 1% to about 60% with respect to the thermo-curable mixture in consideration of the flowability and wettability in the thermo-curable mixture.

Additionally, to increase the electrical conductivity and thermal conductivity between conductive patterns using the low melting point solder, the thermo-curable mixture may further include Carbon Nano Tube-Copper (CNT-Cu). The CNT-Cu may be in the range of about 0.1 volume % to about 50% with respect to the thermo-curable mixture.

A method of forming a flip chip using the composition according to embodiments of the present invention will be described with reference to FIGS. 1 through 4.

Referring to FIG. 1, first conductive patterns 112 may be formed on a first substrate 110. Second conductive patterns 122 may be formed on a second substrate 120. The first and second conductive patterns 112 and 122 may be formed of a metallic material.

The first and second substrates 110 and 120 may face each other such that the first conductive patterns 112 and the second conductive patterns 122 face each other. An anisotropic conductive adhesive 130 may be provided between the first and second substrates 110 and 120. The anisotropic conductive adhesive 130 may be provided at room temperature. The anisotropic conductive adhesive 130 may include a thermo-curable mixture 136 and a low melting point solder 135. The thermo-curable mixture 136 may have a shape of a film or a paste, and the low melting point solder 135 may be dispersed in the thermo-curable mixture 136.

A space between the first and second substrates 110 and 120 may be determined by the anisotropic conductive adhesive 130. The space between the first and second substrates 110 and 120 may be a first space D1. In this state, particles of the low melting point solder 135 may be dispersed in the thermo-curable mixture 136.

Figure 2:
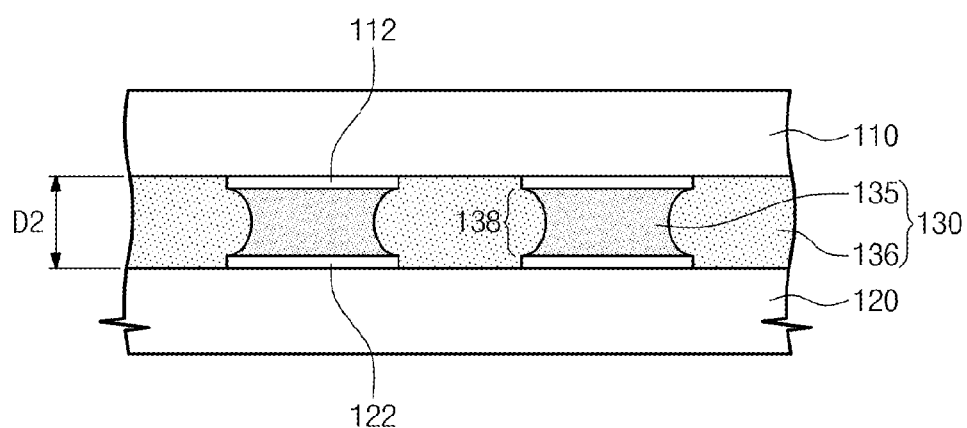
Figure 4:
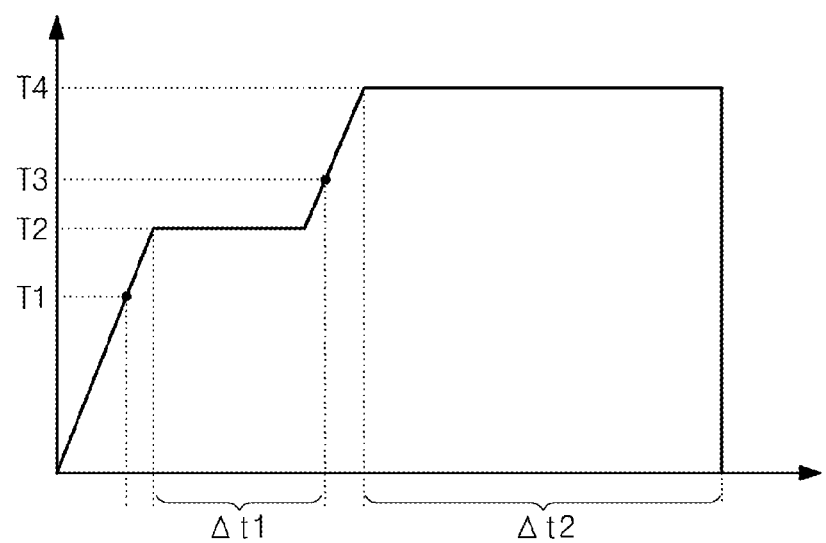
FIG. 4 is a graph showing temperature versus time of the anisotropic conductive adhesive according to the embodiment of the present invention.

Referring to FIGS. 2 and 4, heat energy, which increases progressively, may be supplied to the anisotropic conductive adhesive 130. When the temperature of the anisotropic conductive adhesive 130 reaches a first temperature T1, the particles of the low melting point solder 135 may start to be molten. The first temperature T1 may be the melting point of the low melting point solder 135.

The supply of the heat energy to the anisotropic conductive adhesive 130 continues so that the temperature of the anisotropic conductive adhesive 130 may reach a second temperature T2. The second temperature T2 may be maintained for a first maintenance time Δ t1. The thermo-curable mixture 136 may have low viscosity for the first maintenance time Δ t1. The thermo-curable mixture 136 may have minimum viscosity or at least viscosity lower than the viscosity at room temperature. For example, the viscosity of the thermo-curable mixture 136 may be in the range of about 10 cps to about 1,000 cps. More preferably, the viscosity of the thermo-curable mixture 136 may be in the range of about 10 cps to about 100 cps. Since the viscosity of the thermo-curable mixture 136 is low, the low melting point solder 135 molten in the thermo-curable mixture 136 can flow and agglomerate more easily. At this time, surfaces of the first and second conductive patterns 112 and 122 may be in wetting state due to the molten low melting point solder. In order for the surfaces of the conductive patterns 112 and 122 to be in wetting state, the first maintenance time Δ t1 may be in the range of about 5 seconds to about 20 seconds. The viscosity of the thermo-curable mixture 136 may be in the range of about 10 cps to about 100 cps.

Thereafter, the low melting point solders 135 may agglomerate on the surfaces of the first and second conductive patterns 112 and 122. Resultingly, contact portions 138 may be formed to electrically connect the first and second conductive patterns 112 and 122 to each other. A gap between the first and second substrates 110 and 120 may be a second space D2. The second space D2 may be smaller than the first space D1 to improve wetting properties. Depending on the second space D1 and an agglomeration time, the surface of the contact portion 138 in contact with the thermo-curable mixture 136 may have a concave shape.

Figure 3:
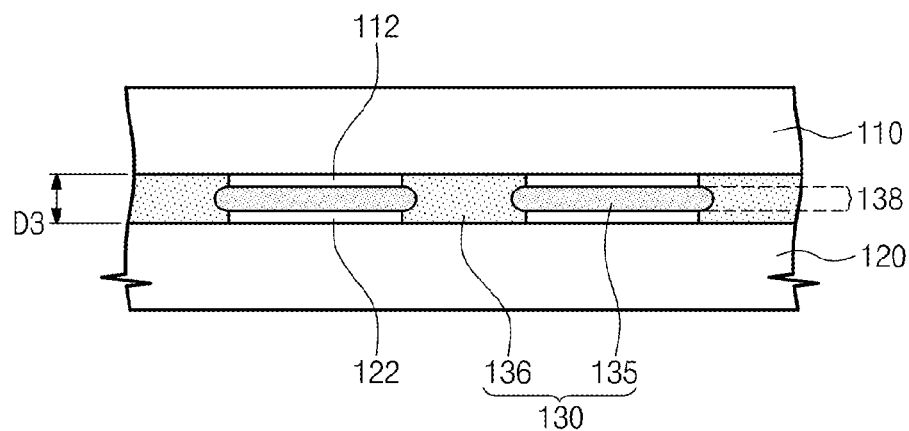

Referring to FIGS. 3 and 4, heat energy is supplied to increase the temperature of the thermo-curable mixture 136 to a third temperature T3. A space between the first and second substrates 110 and 120 may be a third space D3. The third space D3 may be smaller than the second space D2 so as to increase a contact area between the low melting point solder and the conductive patterns 112 and 122. To increase the integration degree of a device, the space between the first and second substrates 110 and 120 may be narrowed. This allows the first and second substrates 110 and 120 to get closer so that the surface of the contact portion 138 contacting the thermo-curable mixture 136 may have a convex shape. While the space between the first and second substrates 110 and 120 is adjusted, the polymer resin may maintain its viscosity minimally.

An oxide layer formed on the surface of the low melting point solder particle 135 may be removed by the reductant in the thermo-curable mixture 136 or a material produced through the reaction between the polymer resin and the curing agent. Thus, the low melting point solder can be molten and easily agglomerate.

When heat energy is supplied and the temperature of the thermo-curable mixture 136 reaches a third temperature T3, the thermo-curable mixture 136 may start to be cured. When the heat energy is supplied on and on, the temperature of the thermo-curable mixture 136 may be increased to a fourth temperature T4. The fourth temperature T4 may be maintained for a second maintenance time Δ t2. When the fourth temperature T4 is maintained below the second maintenance time Δ t2, the thermo-curable mixture 136 is not completely cured. For the second maintenance time Δ t2, the thermo-curable mixture 136 can be sufficiently cured. Accordingly, if the fourth temperature T4 is maintained for a time longer than the second maintenance time Δ t2, a process time is unnecessarily increased.

Since the curing temperature of the polymer resin is higher than the melting point of the low melting point solder, the polymer resin may be cured after the contact portion electrically connecting the conductive patterns is formed.

A composition for an anisotropic conductive adhesive and a method of manufacturing the same will be described below according to a comparative example and embodiments of the present invention. The anisotropic conductive adhesive may include a thermo-curable mixture and a low melting point solder.

COMPARATIVE EXAMPLE

A curing agent of DiaminoDiphenyl Sulfone (DDS) and a polymer resin of DiGlycidyl Ether of Bisphenol of A (DGEBA) were mixed. An equivalence ratio of the curing agent to the polymer resin was about 0.3. When high temperature heat (e.g., about 130° C.) is applied to dissolve the curing agent of DDS, the polymer resin of DGEBA may be cured to increase the viscosity. Therefore, the curing agent of DDS were dissolved in a diluent of Brominated Diphenyl Ethers (BDE) and then mixed with the DGEBA.

For example, about 100% by weight of the DDS and about 33% by weight of the BDE were mixed. Specifically, the DDS and the BDE were mixed for about 20 minutes at about 130° C. so as to dissolve the whole DDS. A solution of the DDS and the BDE had the viscosity of about 1,000 cps at room temperature.

This solution and the DGEBA were mixed for about 20 minutes at room temperature such that they were uniformly mixed. Afterwards, a catalyst was supplied to the mixture including the DGEBA, and the mixture with the catalyst added was mixed for about 5 minutes. About 4% by weight of $BF_3$-Mono Ethyl Amine ($BF_3$-MEA) was supplied as the catalyst. Thereafter, about 10% by weight of maleic acid as the reductant was supplied to the mixture having the catalyst, and the mixture with the reductant added was mixed for about 5 minutes. As a result, a thermo-curable mixture was prepared.

The low melting point solder with the composition of 58Sn/42Bi, which has about 40 volume % with respect to the thermo-curable mixture, was mixed with the thermo-curable mixture at room temperature, thereby manufacturing an anisotropic conductive adhesive.

Embodiment 1

A curing agent of DDS and a polymer resin of DGEBA were mixed. An equivalence ratio of the curing agent to the polymer resin was about 0.3. About 100% by weight of the DDS was dissolved in a diluent of about 33% by weight of BDE, and then mixed with the DGEBA.

The DDS and the DGEBA were mixed for about 20 minutes at about 130° C. to dissolve whole the DDS.

The solution and the DGEBA were mixed for about 20 minutes at room temperature such that they were uniformly mixed. Afterwards, a catalyst was supplied to the mixture including the DGEBA, and the mixture the catalyst added was mixed for about 5 minutes. About 4% by weight of $BF_3$-Mono Ethyl Amine ($BF_3$-MEA) was supplied as the catalyst. Thereafter, about 10% by weight of maleic acid as the reductant was supplied to the mixture having the catalyst, and about 20% by weight of polydimethylsiloxane as a deforming agent was added to the mixture and then mixed at room temperature. As a result, a thermo-curable mixture was prepared. The thermo-curable mixture was mixed for about 5 minutes.

The low melting point solder with the composition of 58Sn/42Bi, which has about 40 volume % with respect to the thermo-curable mixture, was mixed with the thermo-curable mixture at room temperature, thereby manufacturing the anisotropic conductive adhesive.

Embodiment 2

A curing agent of maleic anhydride and a polymer resin of DGEBA were mixed. An equivalence ratio of the curing agent of the maleic anhydride to the DGEBA was about 0.3. The maleic anhydride can be solved at a temperature lower than the curing temperature of the polymer resin, and thus a diluent was not additionally used. The curing agent of the maleic anhydride and the polymer resin were mixed at about 100° C. so that a thermo-curable mixture was prepared.

The low melting point solder with the composition of 58Sn/42Bi, which has about 40 volume % with respect to the thermo-curable mixture, was mixed with the thermo-curable mixture at room temperature, thereby manufacturing an anisotropic conductive adhesive.

The low melting point solder could serve as a curing catalyst because the curing agent of anhydride family was used. In addition, a carboxyl group, which was produced by the reaction between the curing agent and a hydroxyl group (OH) in the polymer resin, acted as the reductant.

Embodiment 3

A curing agent of maleic anhydride and a polymer resin of DGEBA were mixed. An equivalence ratio of the curing agent of the maleic anhydride to the DGEBA was about 0.3. The curing agent of the maleic anhydride and the polymer resin were mixed at about 100° C. Afterward, about 20% by weight of polydimethylsiloxane as a deforming agent was added to the resultant and then mixed at room temperature. As a result, a thermo-curable mixture was prepared.

The low melting point solder with the composition of 58Sn/42Bi, which has about 40 volume % with respect to the thermo-curable mixture, was mixed with the thermo-curable mixture at room temperature, thereby manufacturing an anisotropic conductive adhesive.

The aforesaid thermo-curable mixture of the embodiments 2 and 3 may further include a catalyst, a reductant and/or CNT-Cu.

Figure 5:
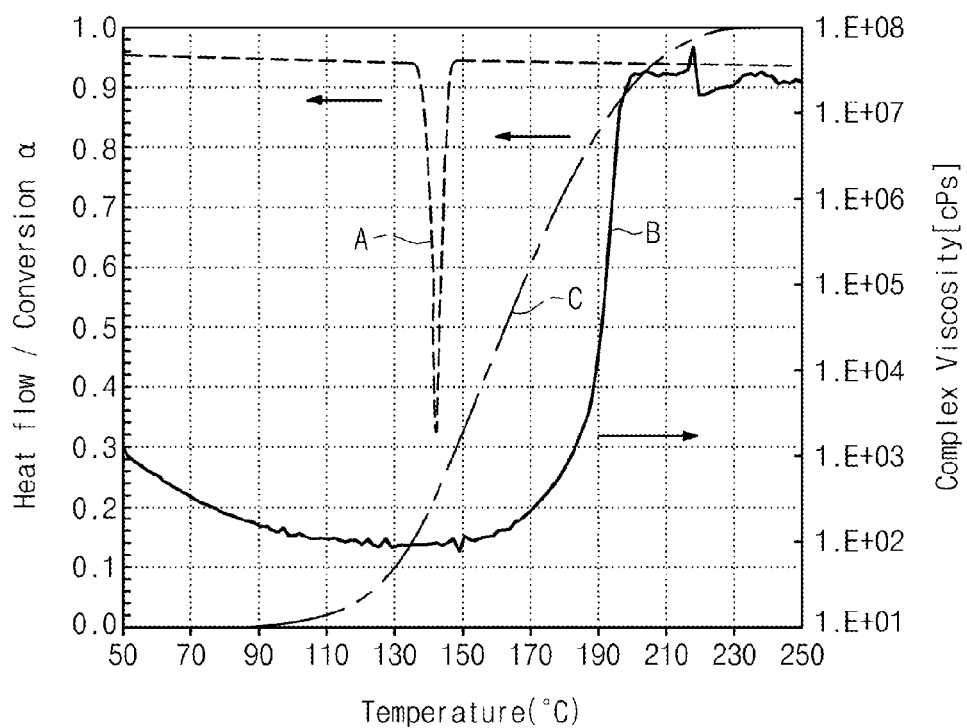
FIG. 5 is a graph showing experimental results of a low-melting point solder and a thermal-curable polymer resin included in the anisotropic conductive adhesive according to the embodiment of the present invention, which are analyzed by a differential scanning calorimetry (DSC) and a rheometrices dynamic analyzer (RDA)

Curing properties of the polymer resin and melting properties of the low melting point solder in the composition for an anisotropic conductive adhesive prepared according to the embodiments and the comparative example will be described below with reference to FIG. 5. In FIG. 5, x-axis represents temperature, right y-axis represents complex viscosity, and left y-axis represents heat flow and conversion. The curing and melting properties were tested using a differential scanning calorimetry (DSC). In addition, viscosity versus temperature of the polymer resin was measured using a rheometrics dynamic analyzer (RDA). The anisotropic conductive adhesive was interposed between substrates having conductive patterns facing each other.

In the DSC, the temperature was increased by about 10° C./min The low melting point solder (A) was molten at about 140° C., and the curing conversion ratio (C) of the polymer resin at about 140° C. was about 0.2. That is, the polymer resin (B) could have a low viscosity of about 100 cps at about 140° C. The viscosity of the polymer resin was sharply increased at about 170° C. Here, the curing conversion ratio (C) of the polymer resin was about 0.6, which indicates that the polymer resin was rapidly cured.

In the comparative example and the embodiments, the polymer resin and the low melting point solder can maintain their original curing temperature and melting temperature. In the embodiments, however, the thermo-curable mixture having the curing agent of anhydride family can function as the anisotropic conductive adhesive while not requiring an additional catalyst and reductant, which differs from the comparative example. The anisotropic conductive adhesive of the embodiments using the deforming agent exhibits superior wetting properties to the other anisotropic conductive adhesives according to the comparative example and the embodiment.

Hereinafter, a method of forming a solder bump and a method of forming a flip chip using the composition according to the embodiments will be described.

A method of forming a solder bump according to one embodiment of the present invention will be described with reference to FIGS. 6 through 9.

Figure 6:
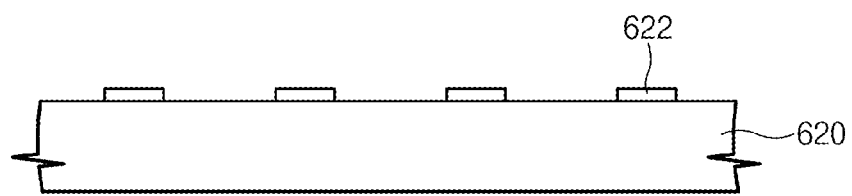
FIGS. 6 through 9 are schematic cross-sectional views illustrating a method of forming a solder bump according to one embodiment of the present invention.

Referring to FIG. 6, first conductive patterns 622 may be formed on a first substrate 620. The first substrate 620 may be a silicon wafer or a Printed Circuit Board (PCB). The first conductive patterns 622 may be formed of a metallic material. For example, the metallic material may include aluminum, copper, and/or gold.

Figure 7:
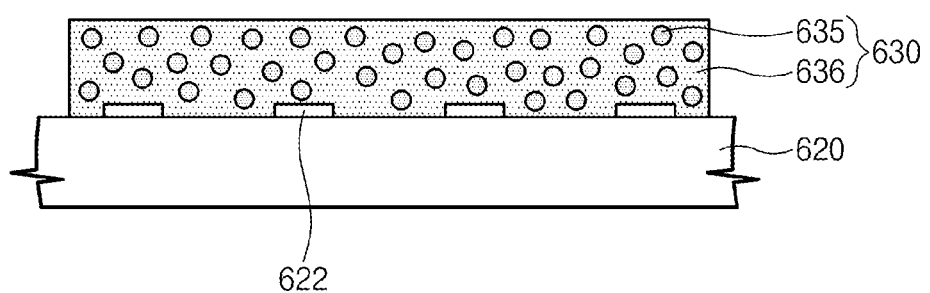

Referring to FIG. 7, a first composition 630 including a low melting point solder may be provided on the first substrate 620. The first composition 630 may be provided at room temperature. The first composition 630 may include a curable mixture 636 and a low melting point solder 635. The curable mixture 636 is the thermo-curable mixture as described above, and may include an amount of a curing agent less than the aforesaid amount in the composition for an anisotropic conductive adhesive. In this state, the curable mixture 636 may be provided as a film or a paste, and the low melting point solder 635 may be dispersed in the curable mixture 636. The first composition 630 may be provided using a screen printer, and the first substrate 620 may be covered with a film of the first composition 630. In this state, the thickness of the film of the first composition 630 may be controlled in consideration of the size and pitch of the first conductive patterns 622 and the size of a solder bump. For example, the thickness of the film of the first composition 630 is greater than the height of the first conductive patterns 622, and may be formed to have a thickness greater than the height of a solder bump to be formed.

Figure 8:
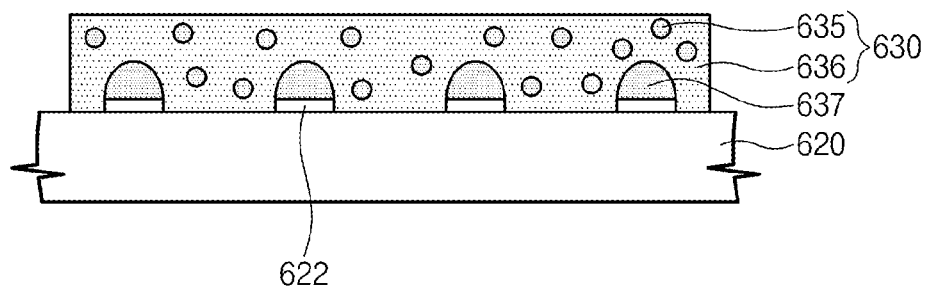

Referring to FIG. 8, heat energy is supplied to the first composition 630. The temperature of the first composition 630 may be maintained at a temperature higher than the melting point of particles of the low melting point solder 635 and lower than the temperature of the curing reaction of the curable mixture 636 (thermo-curable mixture), by the heat energy (See FIG. 4). In this state, as described above in FIG. 4, the curable mixture 636 may maintain low viscosity, and particles of the low melting point solder 635 may be molten to be agglomerated on the first conductive patterns 622. Thus, a solder bump 637 may be formed on the first conductive patterns 622. When particles of the low melting point solder 635 are molten and the first conductive patterns 622 are in wetting state by the low melting point solder, the temperature of the first composition 630 may be decreased rapidly.

Figure 9:
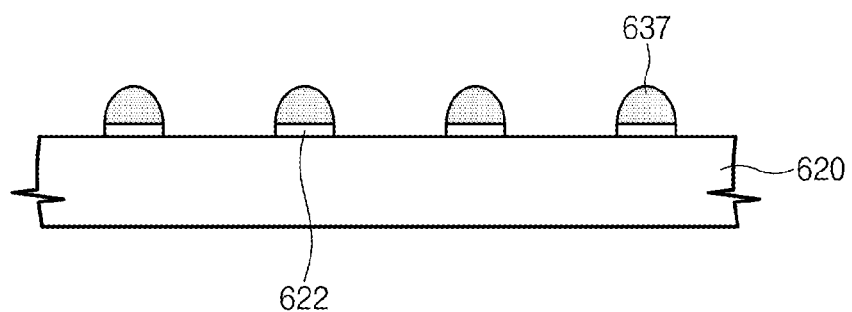

Referring to FIG. 9, afterward, the first composition 630 including remaining particles of the low melting point solder 635 not used in the formation of the solder bump 637 may be removed on the first substrate 620. The first composition 630 may be removed by an organic solvent. The organic solvent may include al least one selected from the group consisting of, for example, Isopropyl Alcohol (IPA), methyl ethyl ketone (MEK), MEK/toluene, methanol (45%)/dichloromethane (40%)/distilled water (15%), acetone, chloroform, dimethyl sulfoxide (DMSO), tetrahydrofuran (THF), dimethyl formaide (DMF), ethyl acetate, carbon tetrachloride, toluene, benzene, acetic acid, and 1-chlorobenzene.

A method of forming a solder bump according to another embodiment of the present invention will be described with reference to FIGS. 10 and 11.

Figure 10:
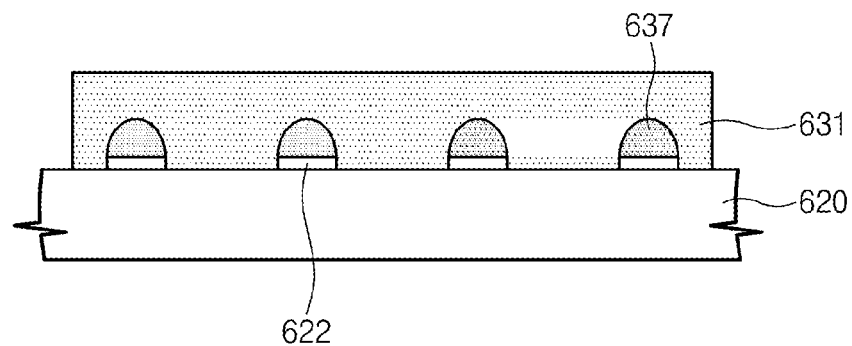
FIGS. 10 and 11 are schematic cross-sectional views illustrating a method of forming a solder bump according to another embodiment of the present invention.

Referring to FIG. 10, a second composition 631 may be provided on the resultant of FIG. 9. The second composition 631 may be provided on the first substrate 620 to cover the solder bump 637 entirely. The second composition 631 may provided by a spin coating or screen printer method. The second composition 631 may include a thermo-curable mixture, but may not include a low melting point solder. Alternatively, the second composition 631 may be formed of a photo-curable material.

Figure 11:
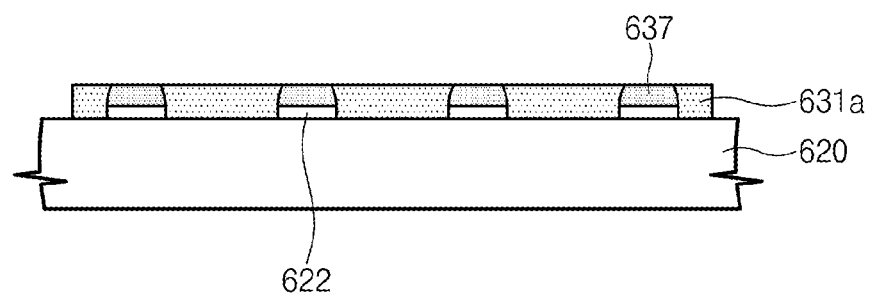

Referring to FIG. 11, the second composition 631 may be cured to form a second composition film 631a on the first substrate 620. The second composition film 631a may be formed at a thickness higher than the height of the solder bump 637. To expose the solder bump 637, the second composition film 631a may be planarized. For example, the second composition film 631a may be planarized by a Chemical Mechanical Polishing (CMP) process.

A method of forming a solder bump according to still another embodiment of the present invention will be described with reference to FIGS. 12 through 19.

Figure 12:
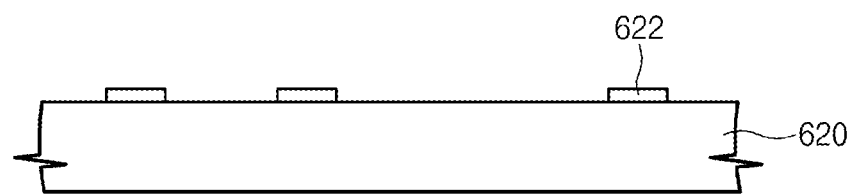
FIGS. 12 through 19 are schematic cross-sectional views illustrating a method of forming a solder bump according to still another embodiment of the present invention.

Referring to FIG. 12, first conductive patterns 622 may be formed on a first substrate 620. The first substrate 620 may be a silicon wafer or a Printed Circuit Board (PCB). The first conductive patterns 622 may be formed of a metallic material. For example, the metallic material may include aluminum, copper, and/or gold. The first conductive patterns 622 may be arranged regularly on some regions of the first substrate 620, while they may not be formed on other regions of the first substrate 620.

Figure 13:
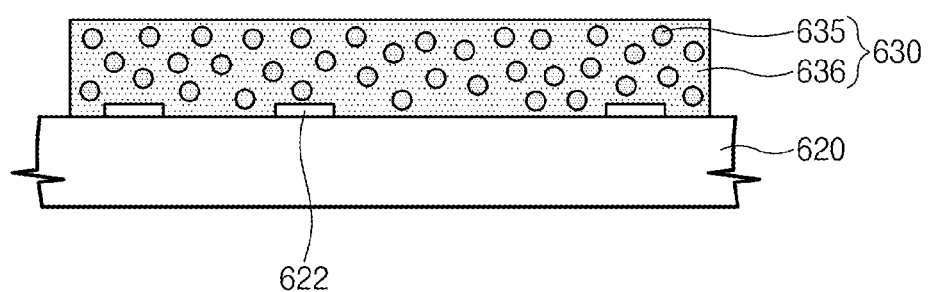

Referring to FIG. 13, a first composition 630 including a low melting point solder 635 may be provided on the first substrate 620. The first composition 630 may be provided at room temperature. The first composition 630 may include a curable mixture 636 and a low melting point solder 635. The curable mixture 636 may include the aforesaid thermal-curable mixture, and may include an amount of a curing agent less than the aforesaid amount. The curable mixture 636 may further include a photo-curable material. The photo-curable material is a cationic phtoinitiator and may include one selected from the group consisting of diaryliodonium salts ($Ar_2I^+X^-$), triarylsulfonium salts, aryldiazonium salts, and onium salts. In this state, the curable mixture 636 may be provided as a shape of a film or a paste, and the low melting point solder 635 may be dispersed in the curable mixture 636. The first composition 630 may be provided using a screen printer, and the first substrate 620 may be covered with a film of the first composition 630. At this time, the thickness of the film of the first composition 630 may be controlled in consideration of the size and pitch of the first conductive patterns 622 and the size of a solder bump. For example, the thickness of the film of the first composition 630 may be formed to have a thickness higher than the height of the first conductive patterns 622 and the height of a solder bump to be formed.

Figure 14:
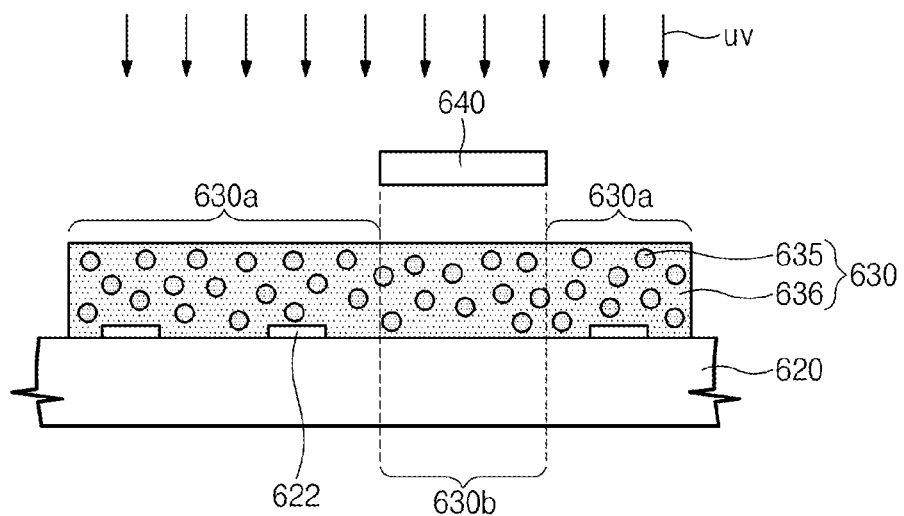

Referring to FIG. 14, the film of the first composition 630 may be divided into a region to be removed 630b and a remaining region 630a by exposing the film to light. The region to be removed 630b may be disposed on the first substrate 620 on which the first conductive patterns 622 are not disposed.

Light (e.g. UV) may be irradiated selectively on some regions of the film of the first composition 630 thereby causing selective cross-linking in the first composition 630. Thus, curing differences of the first composition 630 may appear in each of an irradiated region and a non-irradiated region. For example, the region to be removed 630b may be masked by a mask 640 to expose the remaining region 630a selectively to light. At this time, a cross-linking may occur in the first composition 630 of the remaining region 630a. That is, the first composition 630 in the region to be removed 630a may not be cured. The remaining region 630a may be minimally cured to be patterned.

Figure 15:
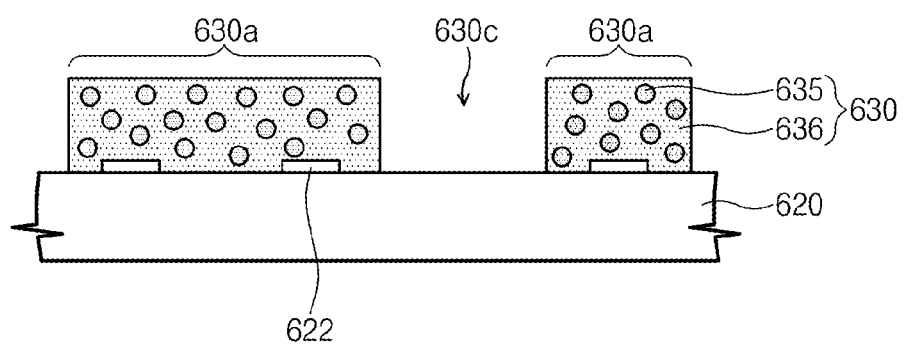

Referring to FIG. 15, the region to be removed 630b may be selectively removed. The remaining region 630a may have an opening 630c exposing a top face of the first substrate 620.

Figure 16:
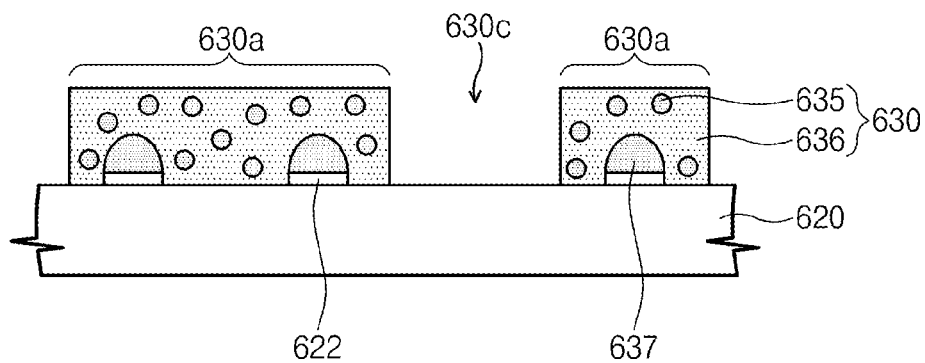

Referring to FIG. 16, heat energy may be supplied to the remaining region 630a. The temperature of the remaining region 630a may be maintained at a temperature higher than the melting point of particles of the low melting point solder 635 and lower than the temperature of the curing reaction of a thermo-curable material of the curable mixture 636, by the heat energy. In this state, as described above in FIG. 4, the curable mixture 636 may maintain low viscosity, and particles of the low melting point solder 635 may be molten to be agglomerated on the first conductive patterns 622. Thus, a solder bump 637 may be formed on the first conductive patterns 622. When particles of the low melting point solder 635 are molten and the first conductive patterns 622 are in wetting state by the low melting point solder, the temperature of the remaining 630a may be decreased rapidly.

Figure 17:
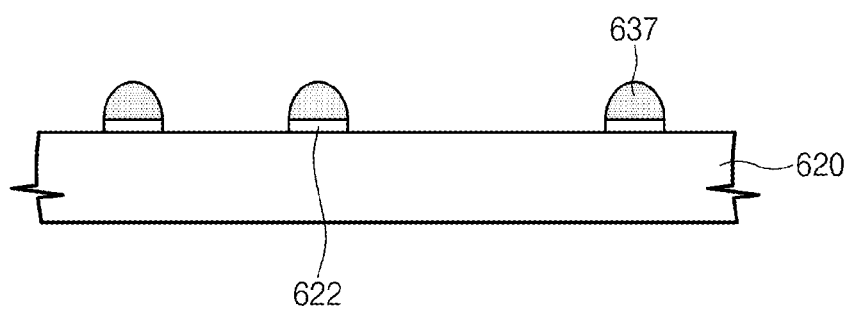

Referring to FIG. 17, afterward, the remaining region 630a including remaining particles of the low melting point solder 635 not used in the formation of the solder bump 637 may be removed on the first substrate 620. The remaining region 630a may be removed by an organic solvent.

Figure 18:
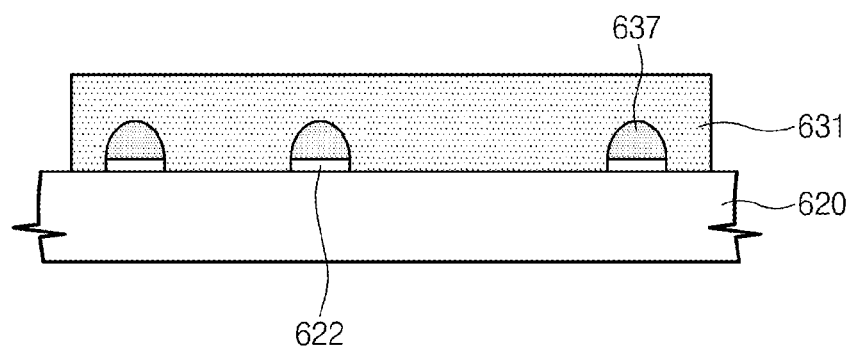

Referring to FIG. 18, a second composition 631 may be provided on the resultant. The second composition 631 may be provided by a spin coating or screen printer method. The second composition 631 may include a thermo-curable mixture, but may not include a low melting point solder. Alternatively, the second composition 631 may be formed of a photo-curable material.

Figure 19:
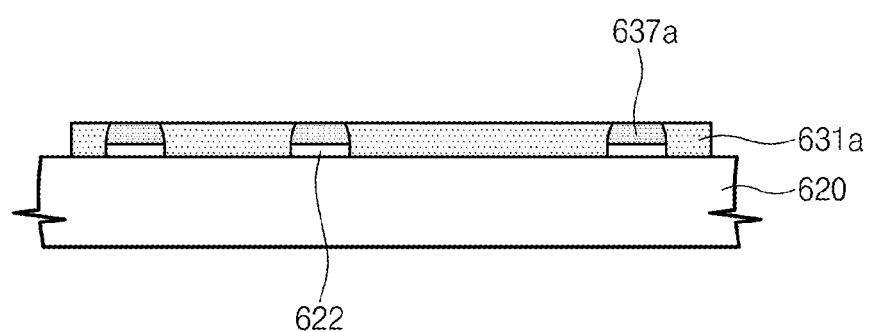

Referring to FIG. 19, the second composition 631 may be cured to form a second composition film 631a on a first substrate 620. The second composition film 631a may be formed at a thickness higher than the height of the solder bump 637. To expose the solder bump 637, the film of the second composition 631a may be planarized. The exposed solder bump 637a may have the same height as that of the second composition film 631a which is planarized. For example, the second composition film 631a may be planarized by a Chemical Mechanical Polishing (CMP) process.

Figure 20:
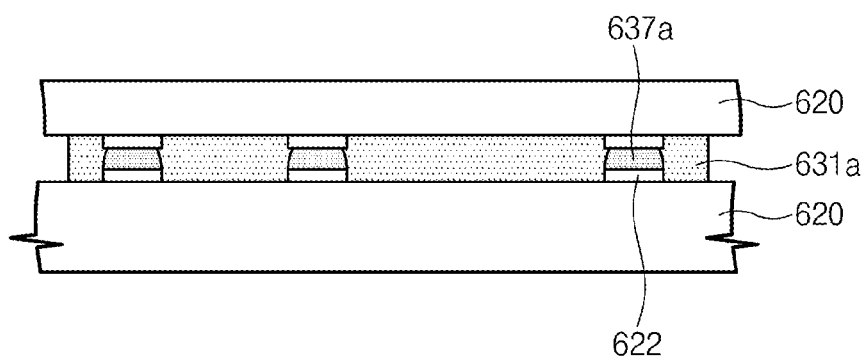
FIG. 20 is a schematic cross-sectional view illustrating a method of forming a flip chip according to one embodiment of the present invention.

A method of forming a flip chip according to embodiments of the present invention will be described with reference to FIG. 20.

First substrates 620 including the exposed solder bumps 637a formed in FIG. 19 may be bound to each other on which the first conductive patterns 622 correspond to each other.

A method of forming a flip chip according to another embodiment of the present invention will be described with reference to FIGS. 21 and 22.

Figure 21:
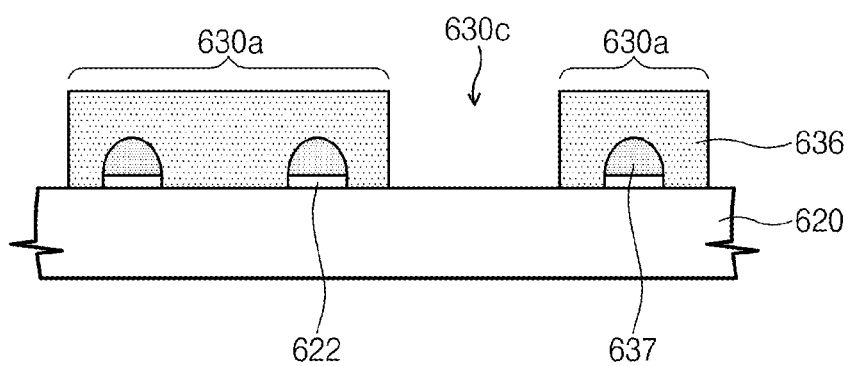
FIGS. 21 and 22 are schematic cross-sectional views illustrating a method of forming a flip chip according to another embodiment of the present invention.
Figure 22:
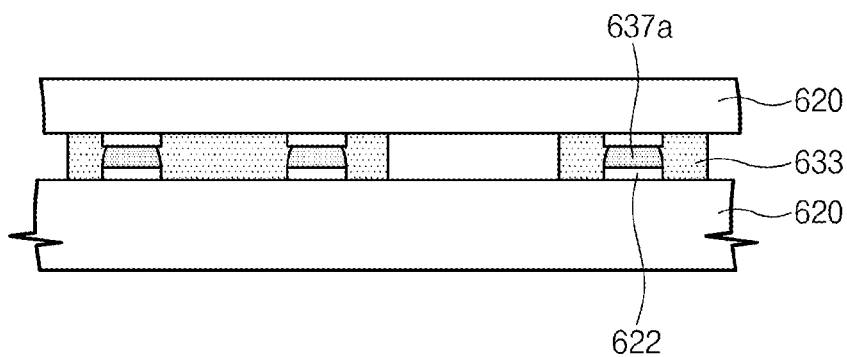

Referring to FIGS. 21 and 22, heat energy may be supplied to the resultant of FIG. 15. Particles of the low melting point solder may be molten to be agglomerated on the first conductive patterns 622, by the heat energy. Thus, a solder bump 637 may be formed on the first conductive patterns 622. In this state, when the amount of the low melting point solder is small, particles of the low melting point solder may not remain in the first composition 630. When a solder bump 637 is formed, the temperature of the first composition 630 may be increased to cure the first composition 630. The first composition 630 may be cured to form a first composition film 633.

To expose the solder bump 637, the first composition film 633 may be planarized. The exposed solder bump 637a may have the same height as that of the first composition film 633 which is planarized. The first substrates 620 including the exposed solder bumps 637a may be bound to each other with the first conductive patterns 622 to correspond to each other. Thus, a region on which conductive patterns are not formed may be remained as an empty space.

Figure 23:
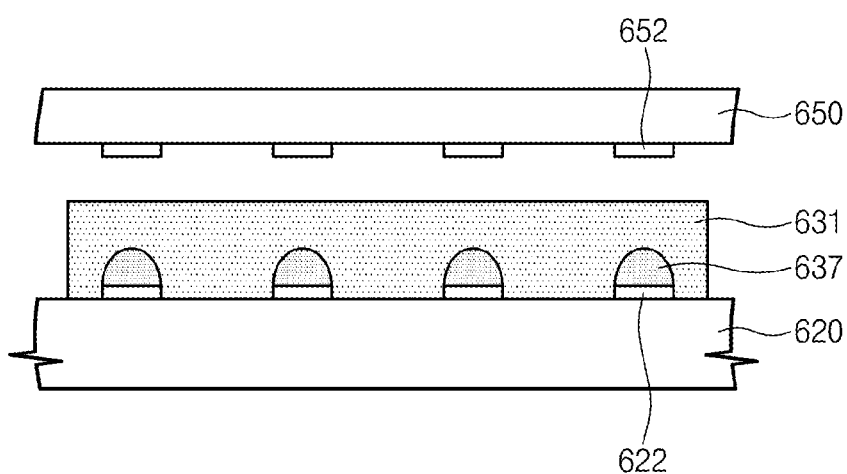
FIGS. 23 and 24 are schematic cross-sectional views illustrating a method of forming a flip chip according to still another embodiment of the present invention.
Figure 24:
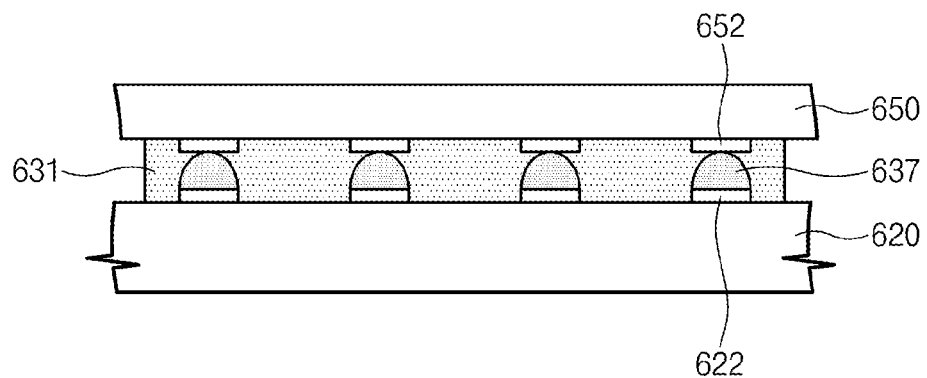

A method of forming a flip chip according to another embodiment of the present invention will be described with reference to FIGS. 23 and 24.

A resultant of FIG. 10 may be prepared. As described above, the resultant of FIG. 10 may include a first substrate 620, first conductive patterns 622 arranged on the first substrate 620, solder bumps 637 each formed on the first conductive patterns 622, and a second composition 631 applied on the first substrate 620 to cover the solder bumps 637. A second substrate 650, on which second conductive patterns 652 corresponding to the first conductive patterns 622 are arranged, may be prepared. The first and second substrates 620 and 650 may be aligned such that the second conductive patterns 652 may correspond to the first conductive patterns 622.

A reflow process may be performed so that the first and second conductive patterns 622 and 652 are connected respectively by the solder bumps 637. In addition, the gap between the first and second substrates 620 and 650 may be filled with the second composition 631. Therefore, the second composition 631 may remove oxide films on the solder bumps 637, and be used as an underfill material of the solder bumps 637. The second composition 631 may be cured.

Alternatively, the first and the second substrates 620 and 650 may be aligned after the second composition 631 is applied on the first substrate 620. Afterward, the reflow process may be performed.

Alternatively, the first substrate 620 on which the solder bumps 637 are formed may be contacted with another substrate that is covered with the second composition 631, so that the second composition 631 can cover the surroundings of the solder bumps 637.

Figure 25:
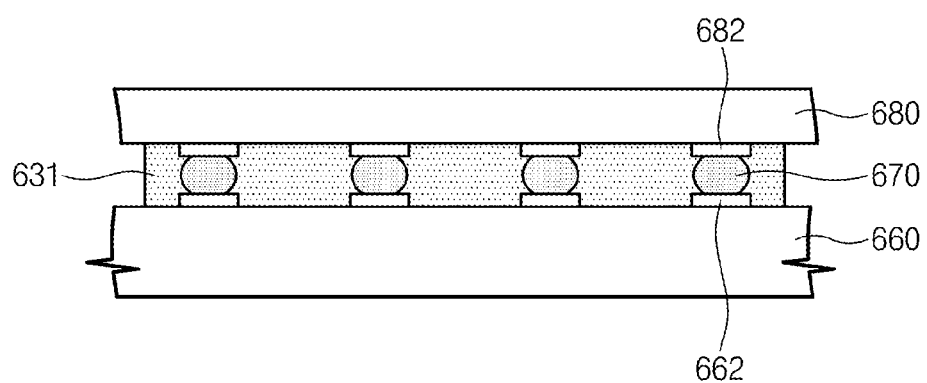
FIG. 25 is a schematic cross-sectional view illustrating a method of forming a flip chip according to even another embodiment of the present invention.

Referring to FIG. 25, a method of forming a flip chip according to still another embodiment of the present invention will be described. A third substrate 660 on which third conductive patterns 662 are arranged may be prepared. A solder ball 670 may be formed on each of the third conductive patterns 662. The solder ball 670 may be formed through a printing step on the third conductive patterns 662 and a Reflow step, using a solder paste. The solder ball 670 may also be formed through a transcribing step of flux on the third conductive patterns 662, a dispensing step of the solder on the third conductive patterns 662, and a reflow step. A second composition 631 may be applied on the third substrate 660 to cover the solder ball 670.

A fourth substrate 680, on which fourth conductive patterns 682 corresponding to the third conductive patterns 662 are arranged, may be prepared. The third and fourth substrates 660 and 680 may be aligned so that the third conductive patterns 662 correspond to the fourth conductive patterns 682.

A reflow process may be performed so that the third and fourth conductive patterns 662 and 682 are connected respectively by the solder balls 370. In addition, the gap between the third substrates 660 and 680 may be filled with the second composition 631. Therefore, the second composition 631 may be used as an underfill material of the solder balls 670. The second composition 631 may be cured.

According to the embodiments of the present invention, the composition for an anisotropic conductive adhesive includes a deforming agent and/or a curing agent. The surface tension of a thermo-curable polymer conductive resin of the anisotropic conductive adhesive may be decreased by the deforming agent. Therefore, the low melting point solder can easily flow in the anisotropic conductive adhesive, making it possible to connect conductive patterns to each other.

The curing agent includes a curing agent of anhydride family. The curing agent of anhydride family reacts with a thermal-curable polymer resin having a hydroxyl group, and can remove oxides on the conductive pattern or the low melting point solder by itself. Therefore, the anisotropic conductive adhesive may not include a reductant or may include a slight amount of the reductant.

According to the embodiments of the present invention, the low melting point solder can easily flow in the anisotropic conductive adhesive, and wetting properties of the conductive pattern surface can be improved. Accordingly, electronic devices manufactured using the anisotropic conductive adhesive may have excellent electrical properties.

Moreover, even if a contact portion formed of a low melting point solder, which connects the conductive patterns to each other, is damaged, the contact portion can be easily recovered by melting the low melting point solder.

The above detailed description exemplarily illustrates the present invention. The aforesaid contents are merely provided to explain the preferred embodiments of the present invention, and thus the present invention is also available under a variety of other combinations, modifications, and environments. In addition, the aforesaid contents can be variously modified or changed within scope of the concept of the present invention disclosed herein, within the contents disclosed herein, and/or within technology or knowledge of those skilled in the art. Thus, the above detailed description of the present invention should not be restricted or limited to the embodiments disclosed herein. Further, the appended claims should be construed to include other embodiments.

What is claimed is:

1. A method of forming a flip chip, comprising:
providing a first substrate on which first conductive patterns are formed and a second substrate on which second conductive patterns are formed;
arranging the first substrate and the second substrate such that the first conductive patterns and the second conductive patterns face each other;
providing a first composition between the first and second substrates such that the first composition comes in contact with an entire upper surface of the second substrate and fills a space between the first and second substrates, the first composition comprising a low melting point solder, a thermal-curable polymer resin, and a curing agent of an anhydride family material; and
forming a contact portion connecting the first and second conductive patterns, the contact portion being made of the low melting point solder.

2. The method of claim 1, wherein the thermal-curable polymer resin comprises a hydroxyl group, a material having a carboxyl group is generated through a reaction between the thermal-curable polymer resin having the hydroxyl group and the curing agent of the anhydride family material, and the material is used as a reductant removing an oxide on the low melting point solder or on the first and second conductive patterns.

3. The method of claim 1, wherein the low melting point solder is used as a curing catalyst.

4. The method of claim 1, further comprising providing a carbon nano tube-copper (CNT-Cu).

5. The method of claim 1, wherein during the providing of the first composition, the space between the first and second substrates is filled with the thermal-curable polymer resin and the low melting point solder is dispersed in the thermal-curable polymer resin.

6. The method of claim 1, wherein the first composition comes in contact with an entire lower surface of the first substrate.

7. The method of claim 1, wherein the forming of the contact portion comprises:
melting the low melting point solder; and
curing the thermal-curable polymer resin.

8. The method of claim 7, wherein, when the low melting point solder is melted, the low melting point solder agglomerates on both a surface of the first conductive patterns and a surface of the second conductive patterns.

* * * * *